(12) United States Patent
Hirabayashi

(10) Patent No.: US 6,724,230 B2
(45) Date of Patent: Apr. 20, 2004

(54) SEMICONDUCTOR INTEGRATED CIRCUIT

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/253,935

(22) Filed: Sep. 25, 2002

(65) Prior Publication Data

US 2003/0057449 A1 Mar. 27, 2003

(30) Foreign Application Priority Data

Sep. 26, 2001 (JP) ........................................ 2001-293620

(51) Int. Cl.$^7$ .............................................. H03H 11/26
(52) U.S. Cl. ........................ 327/280; 327/281; 327/287; 327/288
(58) Field of Search ................................ 327/266, 274, 327/280, 281, 287, 288

(56) References Cited

U.S. PATENT DOCUMENTS

| | | | | |
|---|---|---|---|---|
| 5,412,349 A | * | 5/1995 | Young et al. | 331/34 |
| 5,793,239 A | * | 8/1998 | Kovacs et al. | 327/262 |
| 5,847,616 A | * | 12/1998 | Ng et al. | 331/57 |
| 5,955,929 A | * | 9/1999 | Moon et al. | 331/57 |

OTHER PUBLICATIONS

John G. Maneatis, "Low–Jitter and Process–Independent DLL and PLL Based on Self–Biased Techniques", ISSCC Digest of Technical Papers, 1996 IEEE International Solid–State Circuits Conference, Feb. 9, 1996, pp. 130, 131 and 430.

Ian A. Young, et al. A 0.35μm CMOS 3–880MHz PLL N/2 Clock Multiplier and Distribution Network with Low Jitter for Microprocessor, ISSCC Digest of Technical Papers, 1997 IEEE International Solid–State Circuits Conference, Feb. 8, 1997, pp. 330 and 331.

* cited by examiner

*Primary Examiner*—Timothy P. Callahan
*Assistant Examiner*—Quan Tra
(74) *Attorney, Agent, or Firm*—Oblon, Spivak, McClelland, Maier & Neustadt, P.C.

(57) ABSTRACT

A semiconductor integrated circuit comprising a voltage controlled delay cell including a first voltage controlled resistor and a current source transistor of a MOS type differential amplifier circuit, the first voltage controlled resistor functioning as a load resistor, wherein a resistance value of the first voltage controlled resistor is controlled according to a first bias voltage, and a current of the current source transistor is controlled according to a second bias voltage, and a bias circuit including a first replica circuit and a second replica circuit, the first replica circuit having a structure equivalent to that of the voltage controlled delay cell, the second replica circuit having a structure equivalent to a structure in which the first voltage controlled resistor is replaced by a constant resistor, the bias circuit configured to generate and supply the first bias voltage and the second bias voltage to the voltage controlled delay cell.

12 Claims, 6 Drawing Sheets

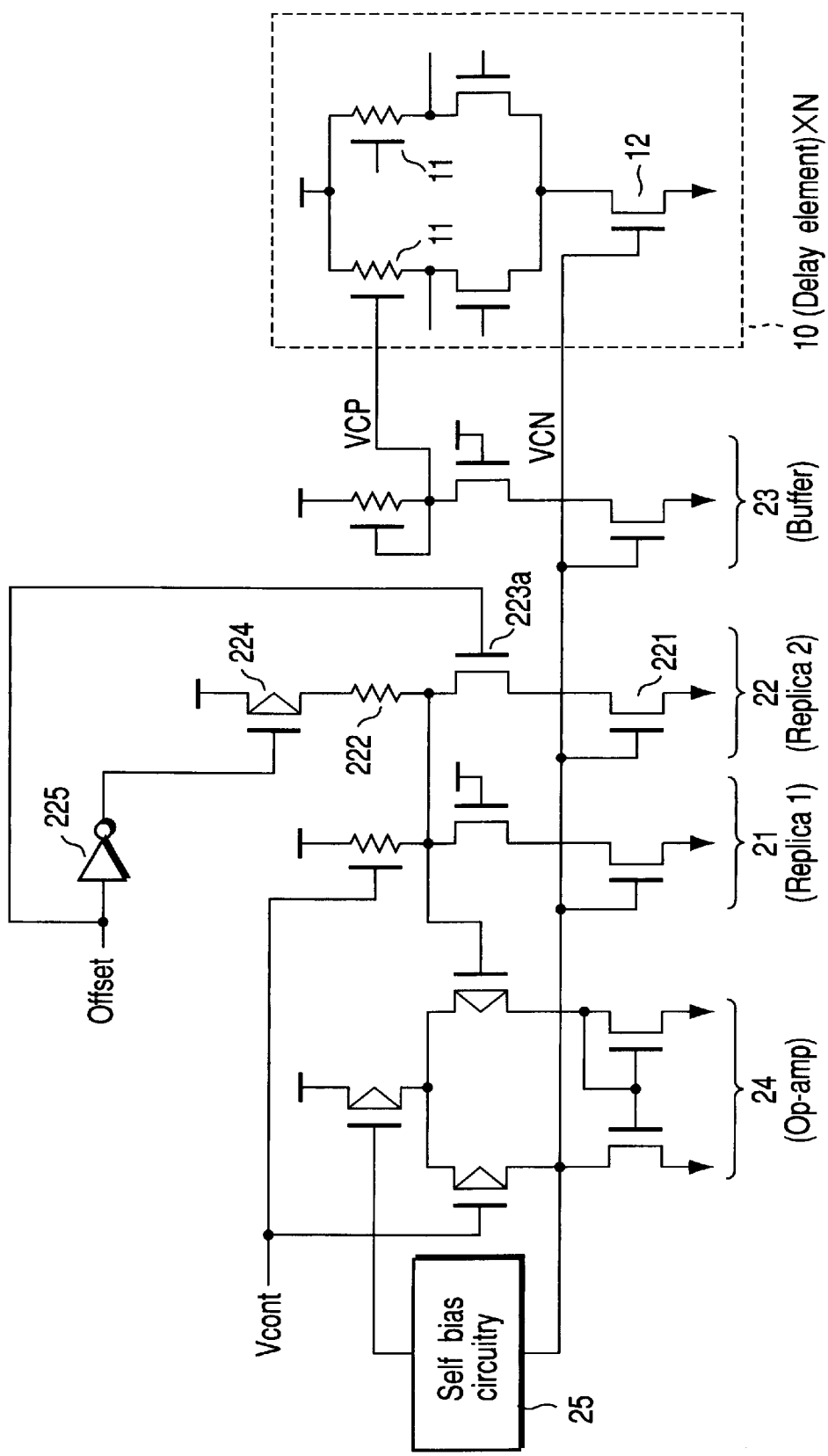
F I G. 3

SEMICONDUCTOR INTEGRATED CIRCUIT

CROSS-REFERENCE TO RELATED APPLICATIONS

This application is based upon and claims the benefit of priority from the prior Japanese Patent Application No. 2001-293620, filed Sep. 26, 2001, the entire contents of which are incorporated herein by reference.

BACKGROUND OF THE INVENTION

1. Field of the Invention

The present invention relates to a semiconductor integrated circuit, and more specifically to a voltage-variable differential type delay circuit that includes a voltage-variable differential type delay cell and a bias circuit, which can be applied to a voltage controlled oscillator that can vary its oscillation frequency in accordance with the level of the control voltage or a voltage controlled oscillator that can vary its delay time in accordance with the level of the control voltage.

2. Description of the Related Art

In accordance with an increase in processing speed of LSIs, there is an increasing demand that a voltage controlled oscillator (VCO), which is widely used as a clock generator for a phase locked loop (PLL) that generates a clock signal within a LSI chip, have an excellent noise tolerance characteristic property and les jitter of frequency.

An example of the VCO with les jitter is a differential type VCO with an improved noise tolerance characteristic, which is achieved by using a voltage variable differential type delay cell in order to cancel same-phase noises.

FIG. 9A illustrates a part of a conventional differential type VCO reported in "ISSCC 1996 DIGEST OF TECHNICAL PAPERS, PP. 130–131".

The differential type VCO includes a plurality (N-number) of voltage variable differential type delay elements 10 that are connected in a ring-like manner. (Note that only one stage portion is shown.) In the voltage variable delay cells 10 of each stage, bias voltages VCP and VCN are supplied from a bias circuit 90 to which a control voltage Vcont is input.

In the voltage variable delay cells 10 of each stage, a VCR (Voltage Controlled Resistor) 11 serving as a load resistor of a MOS differential type amplifier circuit is provided, a bias voltage VCP is input to a control terminal of the VCR 11, and a bias voltage VCN is input to a gate of an NMOS transistor 12 used as a current source of the MOS differential type amplifier circuit.

FIG. 9B is a circuit diagram that shows an example of the VCR 11 in the voltage variable delay cell 10 shown in FIG. 9A.

In the VCR 11, the first PMOS transistor P1 and the second PMOS transistor P2 are connected in parallel to each other, and the gate and drain of the second PMOS transistor P2 are connected to make a short circuit. A bias voltage VCP is input to the gate of the first PMOS transistor P1.

In the voltage variable delay element 10, the resistance of the VCR 11 is controlled in accordance with the bias voltage VCP and the current of the constant current source transistor 12 is controlled in accordance with the bias voltage VCN.

The bias circuit 90 is designed to supply the bias voltages VCP and VCN to the voltage variable delay element 10, and it comprises a replica circuit 21 (Replica), a buffer circuit (Buffer) 23, a MOS-type operational amplifier circuit 24 (Op-Amp) and a self bias circuitry 25.

In the replica circuit 21, a VCR 212 having a structure equivalent to that of the VCR 11 of the voltage variable delay element 10 is connected to an NMOS transistor 211 via an NMOS transistor 213 that is normally ON, and the VCR 212 serves as a load resistor of the NMOS transistor 211. The resistance of the VCR 212 is controlled in accordance with the control voltage Vcont.

In the buffer circuit 23, a VCR 232 having a structure equivalent to that of the VCR 11 of the voltage variable delay element 10 is connected to an NMOS transistor 231 via an NMOS transistor 233 that is normally ON, and the VCR 232 serves as a load resistance of the NMOS transistor 231. A bias voltage VCP generated at one end on the NMOS transistor 231 side of the VCR 232 is supplied to the VCR 11 of the voltage variable delay element 10.

The operational amplifier 24 compares a voltage at one end on the NMOS transistor 211 side of the VCR 212 in the replica circuit 21, with the control voltage Vcont, and generates a bias voltage VCN, so as to control currents of the NMOS transistors 211 and 231 and the constant current source transistor 12 of the voltage variable delay element 10. The self bias circuitry 25 controls a current of the current source transistor 241 of the operational amplifier 24 on the basis of the bias voltage VCN. In this manner, a feedback control is conducted so as to equalize the voltage at the end on the NMOS transistor side of the VCR 212 in the replica circuit 21 and the control voltage Vcont with each other.

With the bias circuit 90 described above, the amplitude of the clock signal that propagates in the voltage variable delay element 10 (that is, the "L" level of the output node signal of the voltage variable delay element 10) is biased so that it is set to be a constant voltage Vcont even if the power voltage varies. Consequently, the variation in the amplitude of the clock signal to a voltage noise can be suppressed, and therefore the jitter of the oscillation frequency of the VCO is reduced.

The oscillation frequency f of the VCO shown in FIG. 9A can be expressed by the following formula:

$$1/f = Reff*Ceff = k*Ceff/(Vcont - Vt) \quad (1)$$

where Reff represents an effective resistance, Ceff represents an effective capacitance of the voltage variable delay element 10, and Vt represents a threshold voltage of the PMOS transistors P1 and P2 that form the VCR 11. With the relationship formulated above, it is understood from FIG. 10 that the oscillation frequency f has such a characteristic that it linearly increases in proportional to a change in the control voltage Vcont.

With regard to the more recent LSIs, there has been a demand of higher frequency and lower voltage. Thus, the gain of the VCO ($\Delta f / \Delta Vcont$) that corresponds to the slope of the line illustrated in FIG. 10 is increased even higher. As the gain is increased, the frequency variation in reply to the variation of the control voltage increases, thereby deteriorating the noise tolerance characteristic.

BRIEF SUMMARY OF THE INVENTION

According to a first aspect of the present invention, there is provided a semiconductor integrated circuit comprising a differential type voltage controlled delay cell including a first voltage controlled resistor element and a current source transistor of a MOS type differential amplifier circuit, the first voltage controlled resistor element functioning as a load resistor, wherein a resistance value of the first voltage controlled resistor element is controlled according to a first bias voltage, and a current of the current source transistor is controlled according to a second bias voltage; and a bias circuit including a first replica circuit and a second replica circuit, the first replica circuit having a structure equivalent to that of the voltage controlled delay cell, the second replica circuit having a structure equivalent to a structure in which the first voltage controlled resistor element of the voltage controlled delay cell is replaced by a constant resistor element, the bias circuit configured to generate and supply the first bias voltage and the second bias voltage to the voltage controlled delay cell.

According to a second aspect of the present invention, there is provided a semiconductor integrated circuit comprising a differential type voltage controlled delay cell including a first voltage controlled resistor element of a MOS type differential amplifier circuit and a constant resistor element which are connected in parallel to each other and a current source transistor of the MOS type differential amplifier circuit, the first voltage controlled resistor element and the constant resistor element functioning as load resistors, wherein a resistance value of the first voltage controlled resistor element is controlled according to a first bias voltage, and a current of the current source transistor is controlled according to a second bias voltage; and a bias circuit including a replica circuit having a structure equivalent to that of the voltage controlled delay cell, the bias circuit configured to generate and supply the first bias voltage and the second bias voltage to the voltage controlled delay cell.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing a VCO of a first alternative example (, in which a switch function for set/non-set of offset is added,) of the first embodiment of the present invention;

DETAILED DESCRIPTION OF THE INVENTION

Embodiments of the present invention will now be described in detail with reference to accompanying drawings.

(First Embodiment)

Figure 1A:
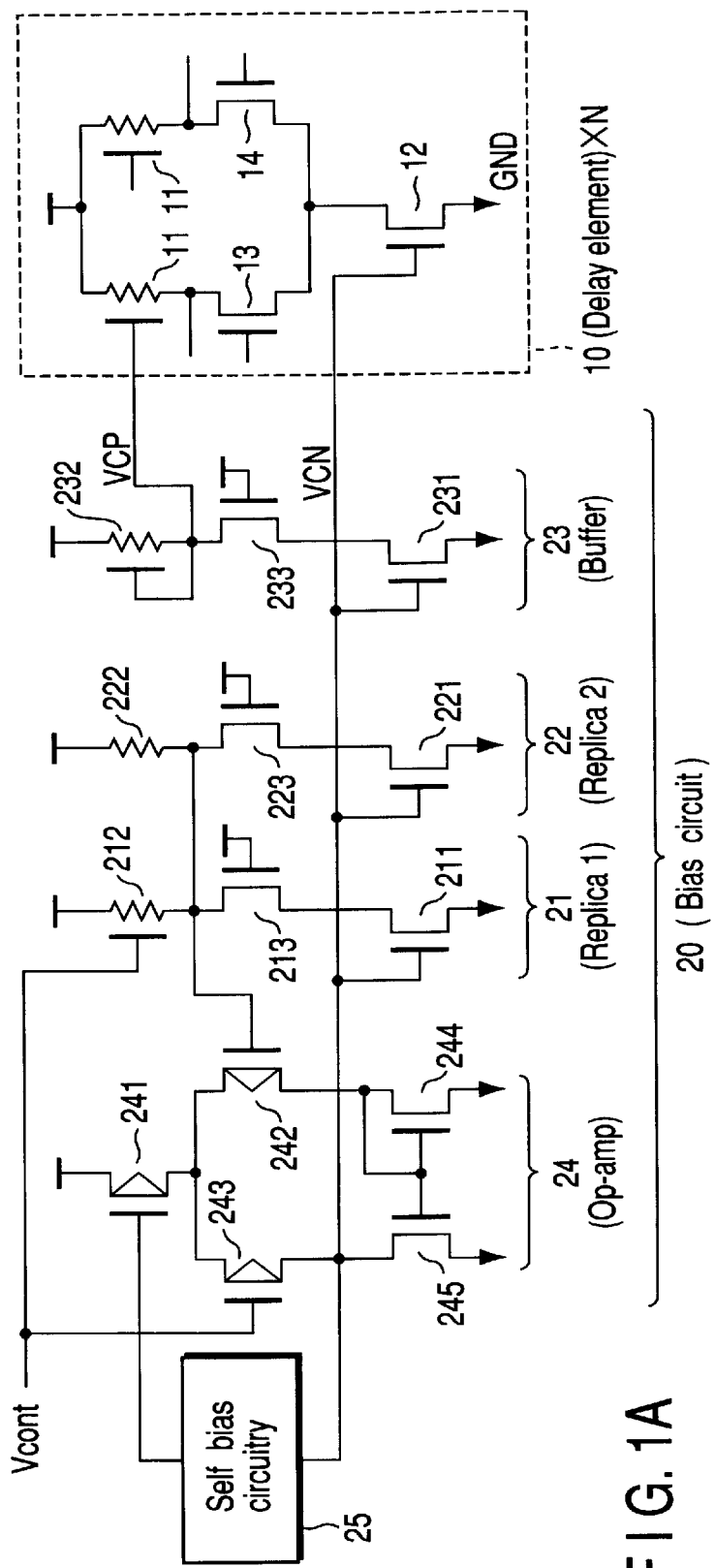
FIG. 1A is a circuit diagram showing an example of a VCO provided in a semiconductor integrated circuit according to a first embodiment of the present invention.

FIG. 1A illustrates a VCO provided in a semiconductor integrated circuit according to a first embodiment of the present invention.

Figure 1B:
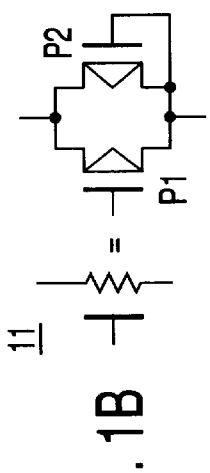
FIG. 1B is a circuit diagram showing an example of a voltage controlled resistor in a voltage variable delay element of the VCO shown in FIG. 1A.

FIG. 1B is a circuit diagram showing an example of a VCR 11 in a voltage variable delay element shown in FIG. 1A.

The VCO shown in FIG. 1A is the same as the conventional VCO described with reference to FIG. 8A, except for a bias circuit 20, and therefore the other elements are designated by the same reference numerals as those used in FIGS. 8A.

Figures 9A, 9B:
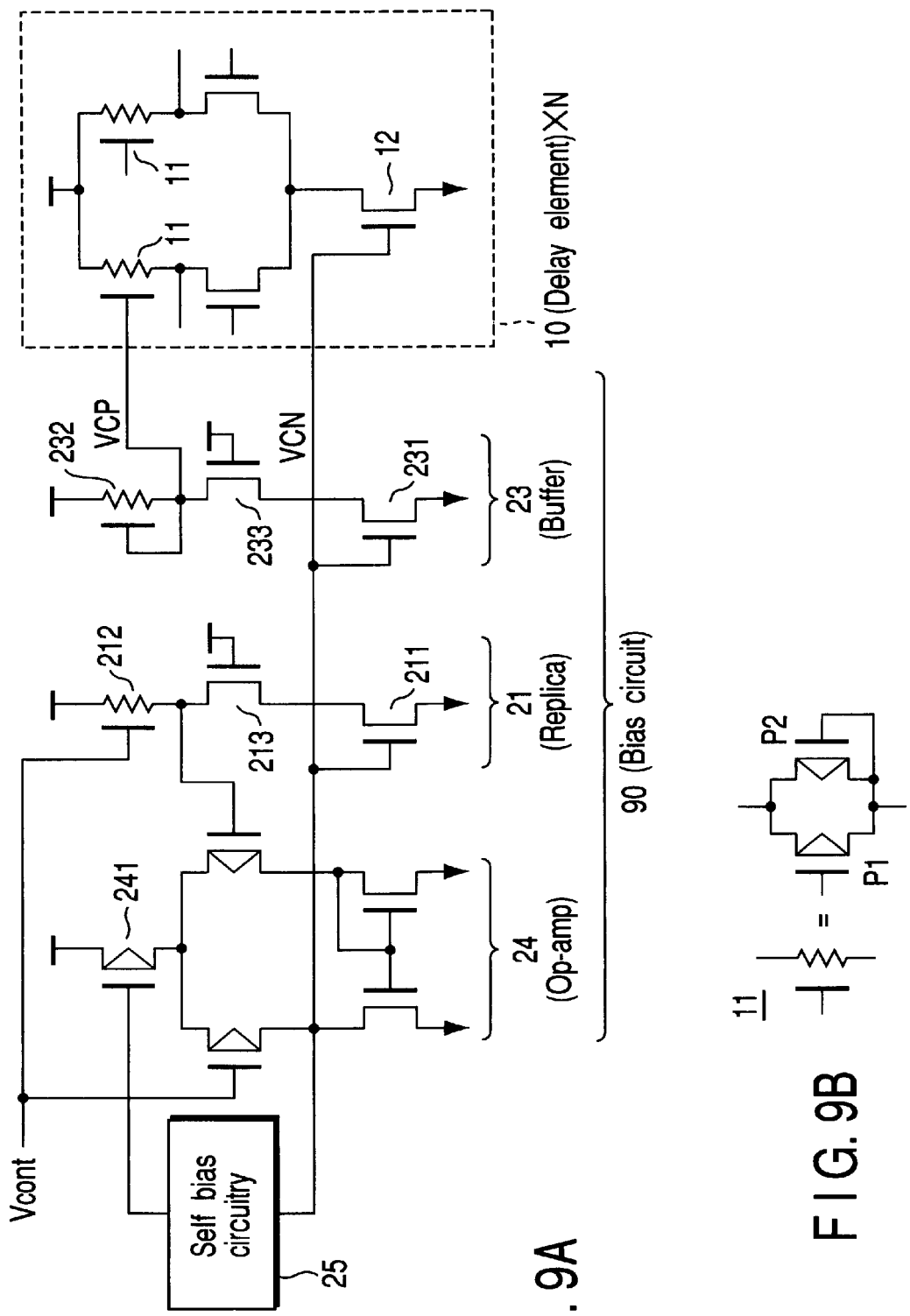
FIG. 9A is a circuit diagram showing an example of a VCO provided in a conventional semiconductor integrated circuit.
FIG. 9B is a circuit diagram showing an example of a voltage controlled resistor in a voltage variable delay element of the VCO shown in FIG. 9A.

The bias circuit 20 comprises a first replica circuit 21 (Replica 1), a buffer circuit 23, an MOS type operational amplifier 24 (Op-Amp) and a self bias circuitry 25, as in the conventional circuit as shown in FIG. 9A. The bias circuit 20 further comprises a second replica circuit 22 (Replica 2), and this feature differs from the conventional circuit as shown in FIG. 9A. A second replica circuit 22 has a structure equivalent to that in which the VCR 11 of the voltage variable delay element 10 is substituted with a constant resistance element.

More specifically, a plurality (N-number) of voltage variable differential type delay elements 10 shown in FIG. 1A are connected in a ring manner to form a differential type VCO, though only one stage portion is shown. In the voltage variable delay cells 10 of each stage, a first bias voltage VCP and a second bias voltage VCN are supplied from a bias circuit 20 to which a control voltage Vcont is input.

In the voltage variable delay element 10 of each stage, a VCR 11 serving as a load resistance of a MOS differential type amplifier circuit is provided, the first bias voltages VCP is input to a control terminal of the VCR 11, and the second bias voltage VCN is input to a gate of an NMOS transistor 12 used for a current source of the MOS differential type amplifier circuit.

As shown in FIG. 1B, in the VCR 11, the first PMOS transistor P1 and the second PMOS transistor P2 are connected in parallel to each other, and the gate and drain of the second PMOS transistor P2 are connected to make a short circuit. A bias voltage VCP is input to the gate of the first PMOS transistor P1.

In the voltage variable delay element 10, the resistance of the VCR 11 is controlled in accordance with the first bias voltage VCP and the current of the current source transistor 12 is controlled in accordance with the second bias voltage VCN.

In the MOS differential type amplifier circuit of the voltage variable delay element 10, the NMOS transistor 12 used for the current source is connected between a source-common connection node of a pair of NMOS transistors 13 and 14 for differential-type input, and a ground potential GND, and the VCR 11 is connected between each one of the pair of NMOS transistors 13 and 14 and a power source node.

The bias circuit 20 is designed to supply the first bias voltage VCP and the second bias voltage VCN to the voltage variable delay element 10, and it comprises the first replica circuit 21 (Replica 1), the second replica circuit 22 (Replica 2), the buffer circuit 23, the operational amplifier 24 (Op-Amp) and the self bias circuitry 25.

In the first replica circuit 21, a VCR 212 having a structure (replica structure) equivalent to that of the VCR 11 of the voltage variable delay element 10 is connected to a first NMOS transistor 211 via an NMOS transistor 213 that is normally ON, and the VCR 212 serves as a load resistance of the first NMOS transistor 211. The resistance of the VCR 212 is controlled in accordance with the control voltage Vcont.

In the second replica circuit 22, a constant resistance element 222 serving as a load resistance of an second NMOS transistor 221 is connected to the second NMOS transistor 221 via an NMOS transistor 223 that is normally ON. Further, one end of the constant resistance element 222, which is located on the second NMOS transistor 221 side, is commonly connected to one end of the VCR 212 of the first replica circuit 21, which is located on the first NMOS transistor 211 side. As the constant resistance element 222, a passive element such as a polysilicon resistance or diffusion resistance is used.

In the buffer circuit 23, a VCR 232 having a structure equivalent to that of the VCR 11 of the voltage variable delay element 10 is connected to the third NMOS transistor 231 via an NMOS transistor 233 that is normally ON, and the VCR 232 serves as a load resistance of the third NMOS transistor 231. The first bias voltage VCP is generated at one end on the third NMOS transistor 231 side of the VCR 232. The buffer circuit 23 serves to separate noise between the first replica circuit 21 and the voltage variable delay element 10, and supply the bias voltage VCP.

The operational amplifier 24 compares a voltage at the common connection node between the VCR 212 of the first replica circuit 21 and the constant resistance element 222 of the second replica circuit 22, with the control voltage Vcont, and generates a second bias voltage VCN, so as to control currents of the first NMOS transistors 211, the second NMOS transistor 221 and the third NMOS transistor 231, and the constant current source transistor 12 of the voltage variable delay element 10. The self bias circuitry 25 controls a current of the current source transistor 241 of the operational amplifier 24 on the basis of the second bias voltage VCN.

In this manner, a feedback control is conducted so as to equalize the voltage at the common connection node between the VCR 212 of the first replica circuit 21 and the constant resistance element 222 of the second replica circuit 22 and the control voltage Vcont with each other.

In the operational amplifier 24, a current source PMOS transistor 241 is connected between the source common connection node of the pair of input-use PMOS transistors 242 and 243 and the power source node, and a current mirror-type load circuit made of NMOS transistors 244 and 245 is connected between the drain of each of the pair of input-use PMOS transistors 242 and 243 and the ground potential GND.

In the buffer circuit 23 of the VCO having the above-described structure, the current of the third NMOS transistor 231 is controlled by the second bias control VCN. Therefore, the level of the first bias voltage VCP supplied to the VCR 11 of the voltage variable delay element 10 from the end of the VCR 232, which is located on the third NMOS transistor 231 side, is not equalized to that of the control voltage Vcont. In other words, the first bias voltage VCP is generated by the buffer circuit 23 at such a level that the current of the VCR 11 of the voltage variable delay element 10 becomes an average of the current of the VCR 212 of the first replica circuit 21 and the current of the constant resistance element 222 of the second replica circuit 22.

Therefore, the oscillation frequency f of the VCO shown in FIG. 1A can be expressed by the following formula:

$$1/f = Reff * Ceff = 2*(dVcp/dVcont)*Ceff/\{k*(Vcont-Vt)+1/R\} \quad (2)$$

where Reff represents the effective resistance of the VCR 11, Ceff represents the effective capacitance of the voltage variable delay element 10, Vt represents the threshold voltage of the PMOS transistors P1 and P2 that form the VCR 11, and R represents the resistance of the constant resistance element 222.

As compared to the formula (1) for the conventional case, the above formula (2) includes a term of differentiation, dVcp/dVcont, and a term of offset that is proportional to 1/R. Here, if the linearity (ΔR/ΔV) of the VCR 11 is high, the term of differentiation, dVcp/dVcont, can be regard as substantially a constant. In this case, the oscillation frequency f of the VCO shown in FIG. 1A has an offset that is proportional to 1/R, and changes linearly in proportional to the change in the control voltage Vcont.

Figure 2:
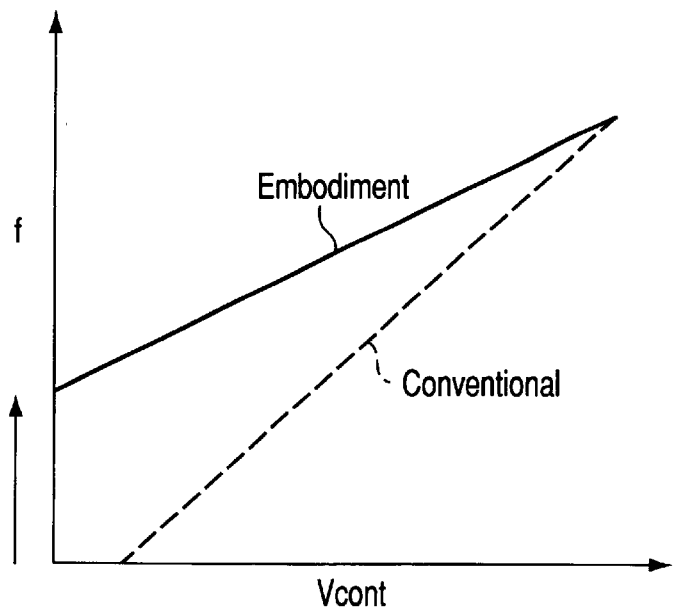
FIG. 2 is a characteristic diagram showing a characteristic line (solid line) of the oscillation frequency of the VCO shown in FIG. 1A, along with, for comparison, that (dotted line) of a prior art example.

FIG. 2 illustrates the characteristics of the oscillation frequency f of the VCO shown in FIG. 1A with a solid line, along with, for comparison, that of the conventional VCO shown in FIG. 9A with a broken line.

As indicated with the solid line in FIG. 2, the characteristics of the oscillation frequency f of the VCO shown in FIG. 1A changes linearly in proportional to the change in the control voltage Vcont. However, it has an offset that is proportional to 1/R, and therefore the inclination is small as compared to that of the conventional case.

To summarize, in the VCO shown in FIG. 1A, since the first replica circuit 21 that uses the VCR 212 and the second replica circuit 22 that uses the constant resistance element 222 are provided, then the frequency characteristic has an offset, which can decrease the inclination of the characteristic. In this manner, it becomes possible to control the gain of the VCO in a high frequency region, and to obtain a high-frequency clock signal while suppressing the gain of the VCO (that is, to obtain a VCO with an excellent noise tolerance characteristic).

(First alternative version of the first embodiment)

As described above, according to the first embodiment, the frequency characteristic is made to have an offset, and therefore the gain of the VCO in a high frequency region can be suppressed. However, at the same time, the frequency band of the VCO is narrowed. As a countermeasure, a first alternative version which has a switch function for the set/non-set of an offset is proposed, as will now be described.

FIG. 3 illustrates a VCO according to the first alternative version of the first embodiment of the present invention.

As compared to the VCO of the first embodiment, the VCO of this alternative version has the following two features: (1) it includes an additional switch element that can shut off the current path of the constant resistance element 222 (in this version, the additional switch element comprises a PMOS transistor 224 inserted between the constant resistance element 222 and the power source node), and the PMOS transistor 224 is selectively driven by a signal obtained by inverting an offset control signal Offset by an inverter 225; and (2) in place of the NMOS transistor 223 which is normally ON, an NMOS transistor 233a which is switched on/off by the offset control signal Offset, is provided. The other structural elements are the same as those of the first embodiment and therefore they are designated by the same reference numerals as those in FIG. 1A.

In the VCO shown in FIG. 3, when the control signal Offset is at "H", the PMOS transistor 224 and the NMOS transistor 223a of the second replica circuit 22 are turned on to allow a current to flow into the constant resistance element 222. This operation creates a structure equivalent to that of the VCO of the first embodiment. Therefore, the oscillation frequency f of the VCO becomes to have such a characteristic that it has an offset as indicated by the solid line in FIG. 2. Thus, it is possible to suppress the gain at a high frequency and obtain a high-frequency clock signal.

On the other hand, when the control signal Offset is at "L", the PMOS transistor 224 and the NMOS transistor 223a of the second replica circuit 22 are turned off to shut the current to the constant resistance element 222 off. This operation creates a structure equivalent to that of the conventional VCO. Therefore, the oscillation frequency f of the VCO becomes not to have such a characteristic that it does not have an offset as indicated by the broken line in FIG. 2. Thus, it is possible to operate it even in a low frequency region.

It should be noted that if the resistance of the switch-use PMOS transistor 224 is set to be sufficiently small as compared to that of the constant resistance element 222, no substantial influence is caused to the frequency characteristics by the insertion of the PMOS transistor 224.

(Second alternative version of the first embodiment)

In the first alternative version of the first embodiment, one set of the switch-use PMOS transistor 224, constant resistance element 222 and switch-use NMOS transistor 233a are provided as the load circuit of the second replica circuit 22, but in this second version, a plurality of such sets are provided as will be provided below.

Figure 4:
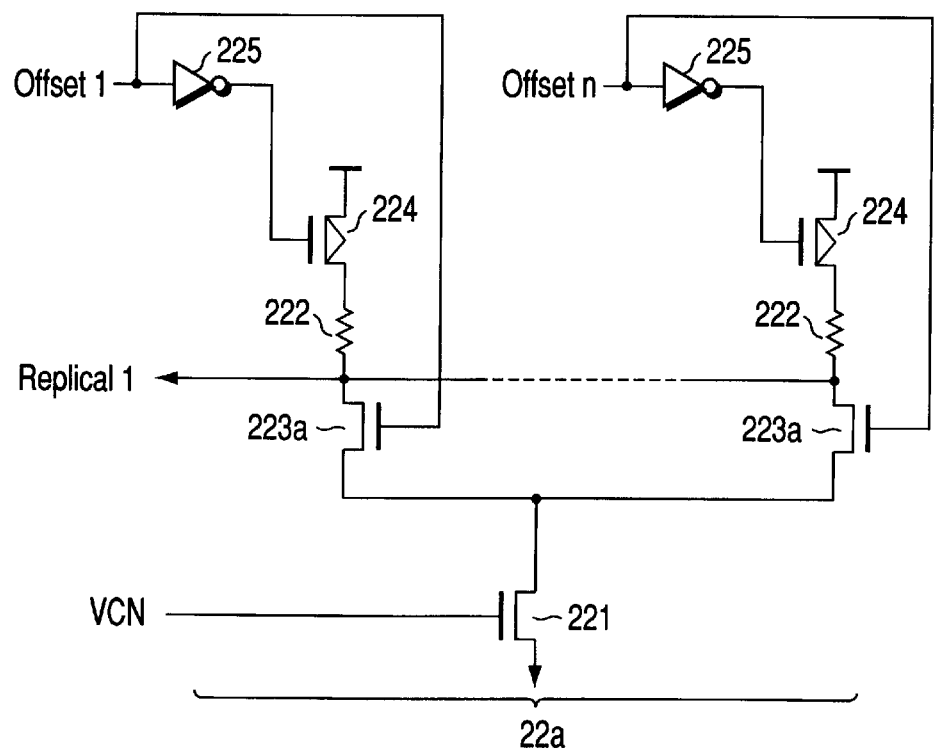
FIG. 4 is a circuit diagram showing a part of a VCO of a second alternative example of the first embodiment of the present invention.

FIG. 4 illustrates a part (the second replica circuit 22a) of a VCO according to the second alternative version of the first embodiment of the present invention.

In the second replica circuit 22a of this VCO, there are a plurality (N-number) of sets of the switch-use PMOS transistor 224, constant resistance element 222 and switch-use NMOS transistor 233a provided as the load circuits, and these sets are selectively driven by the control signals Offset1 to Offsetn, respectively.

In the VCO shown in FIG. 4, when all of the control signals Offset1 to Offsetn are at "H", a current is allowed to flow into the constant resistance element 222 of the n-number of sets of the load circuits. Therefore, the oscillation frequency f of the VCO becomes to have such a characteristic that it has an offset as indicated by the solid line in FIG. 2. Thus, it is possible to suppress the gain at a high frequency and obtain a high-frequency clock signal.

On the other hand, when some of the control signals Offset1 to Offsetn are at "H", and the rest is at "L", a current is allowed to flow into the constant resistance element 222 of some of the n-number of sets of the load circuits. Therefore, the oscillation frequency f of the VCO becomes to have such a characteristic that it has an offset smaller than that as indicated by the solid line in FIG. 2.

Further, when all of the control signals Offset1 to Offsetn are at "L", a current flowing into the constant resistance element 222 is shut off in all of the n-number of sets of the load circuits. This operation creates a structure equivalent to that of the conventional VCO. Therefore, the oscillation frequency f of the VCO becomes to have such a characteristic that it does not have an offset as indicated by the broken line in FIG. 2. Thus, it is possible to operate it even in a low frequency region.

As described above, in the VCO that employs the n-number of sets of the second replica circuit as shown in FIG. 4, the switch function for set/non-set of an offset and the selection function for the offset amount can be created by using control signals Offset1 to Offsetn.

(Third alternative version of the first embodiment)

As in the first alternative version of the first embodiment, a VCO provided with a switch function for set/non-set of an offset in the frequency characteristic is used in this third version. Further, in this alternative version, an output clock of the VCO or a frequency division output clock of a frequency divider that divides the output clock can be selected.

Figure 5:
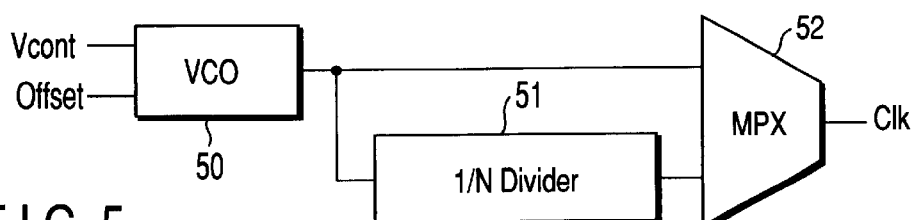
FIG. 5 is a block diagram showing a part of an expanded VCO (in which a switch function for set/non-set of offset and selection function of set/non-set of frequency division) according to a third alternative example of the first embodiment of the present invention.

FIG. 5 is an expanded VCO according to the third alternative version of the first embodiment of the present invention.

The expanded VCO includes a VCO 50 provided with a switch function for set/non-set of an offset, a divider 51 that divides an output clock of the VC050 in 1/N, and a multiplexer (MPX) 52 that selects either one of the output of the VCO 50 and an output of the divider 51.

In the expanded VCO shown in FIG. 5, the set/non-set of an offset in the VCO 50 is controlled and the set/non-set of the division by the multiplexer 52 is selected. In this manner, the combinations of the set/non-set of an offset and the set/non-set of a division can be selected. Thus, it becomes possible to cover a wide frequency band while suppressing the gain, and therefore the frequency band and the gain can be adjusted.

Figure 6:
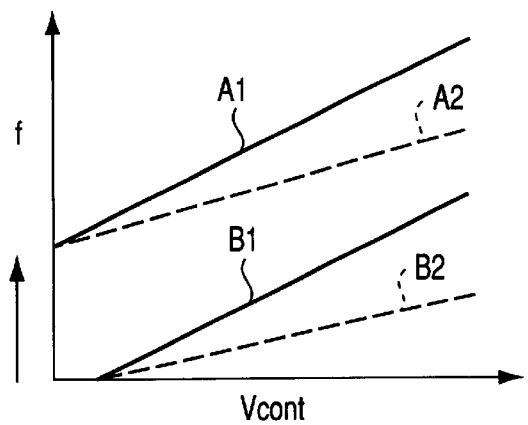
FIG. 6 is a characteristic diagram showing examples of the frequency characteristic of the expanded VCO shown in FIG. 5.

FIG. 6 illustrates a few examples of the frequency characteristics of the expanded VCO shown in FIG. 5.

In FIG. 6, a line A1 indicates a characteristic obtained when an offset is present and a division is absent. A line A2 indicates a characteristic obtained when an offset is present and also a division is present.

Further, a line B1 indicates a characteristic obtained when an offset is absent and a division is absent. A line B2 indicates a characteristic obtained when an offset is absent and a division is present It should be noted that if the divider 51 is of a type in which the division number N is variable, it is possible to control the inclination of the frequency characteristics by controlling the frequency number N. Consequently, the frequency band and the gain can be optimally adjusted.

(Second Embodiment)

Figures 7A, 7B:
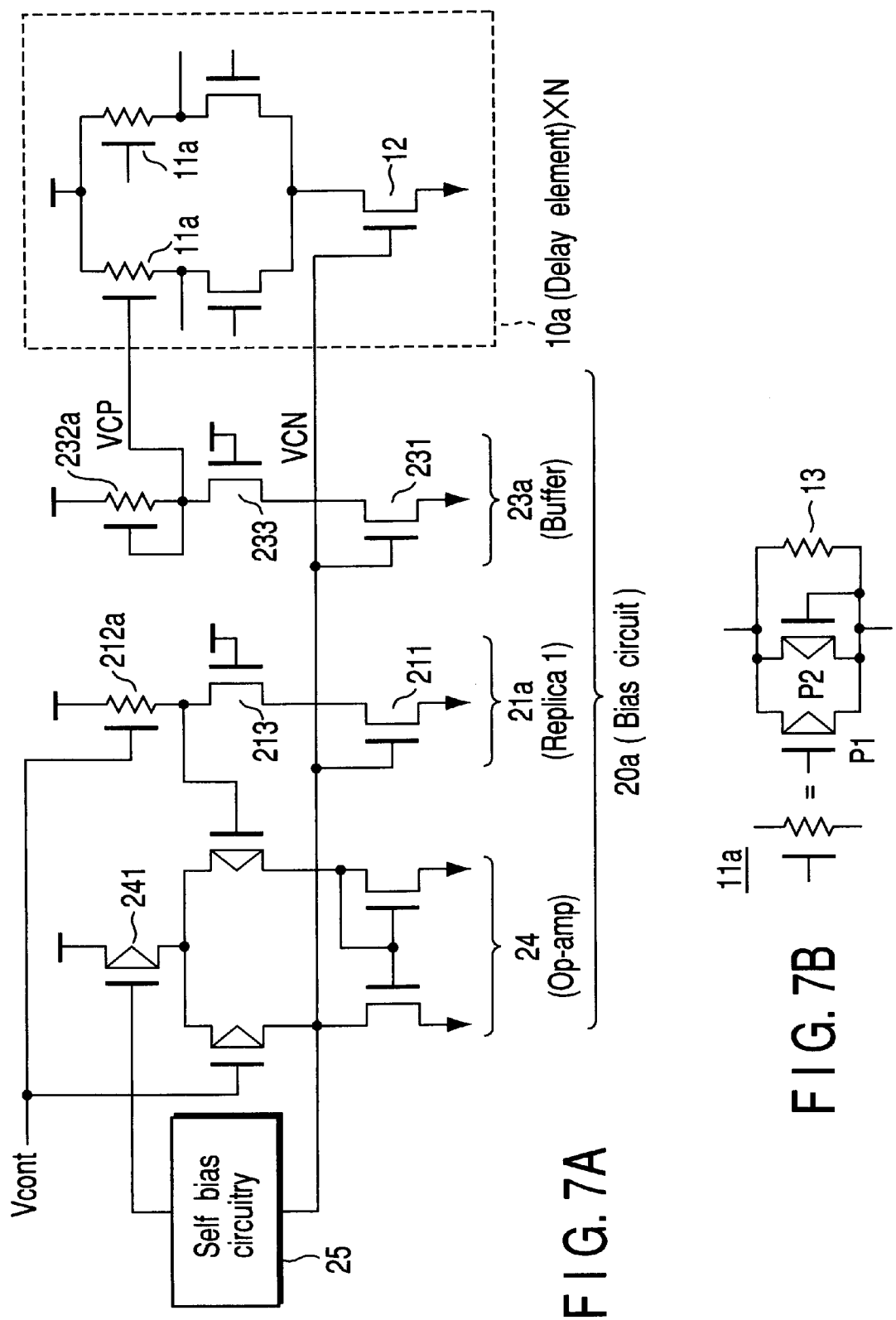
FIG. 7A is a circuit diagram showing an example of a VCO provided in a semiconductor integrated circuit according to a second embodiment of the present invention.
FIG. 7B is a circuit diagram showing an example of a voltage controlled resistor in a voltage variable delay element of the VCO shown in FIG. 7A, in which a constant resistance element 13 is connected in parallel to a voltage controlled resistor formed of parallel-connected PMOS transistors P1 and P2.

FIG. 7A is a circuit diagram showing an example of a VCO provided in a semiconductor integrated circuit according to a second embodiment of the present invention.

The VCO shown in this figure has the same structure as that of the VCO of the first embodiment (FIG. 1A), except that: (1) the second replica circuit 22 is omitted and (2) the voltage variable delay element 10a, the first replica circuit 21a and the buffer circuit 23a have different arrangements from those of the first embodiment. The other elements that are the same as those of the first embodiment are designated by the same reference numerals as those used in FIG. 1A.

As compared to the voltage variable delay element 10, the first replica circuit 21 and the buffer circuit 23 of the first embodiment (FIG. 1A), the VCR 11a of the voltage variable delay element 10a, the VCR 212a of the first replica circuit 21a and the VCR 232a of the buffer circuit 23a have a structure in which a constant resistance elements are added.

FIG. 7B is a circuit diagram illustrating the VCR 11a of the voltage variable delay element 10a in which a constant resistance element 13 is added and connected in parallel to the parallel-connected PMOS transistors P1 and P2.

The first PMOS transistor P1 and the second PMOS transistor P2 are connected in parallel to each other, and the gate and drain of the second PMOS transistor P2 are connected to make a short circuit. A bias voltage VCP is input to the gate of the first PMOS transistor P1. As the constant resistant element 13, a passive element such as a polysilicon resistance or diffusion resistance is used.

The VCR 212a of the first replica circuit 21a and the VCR 232a of the buffer circuit 23a have the same structure as the VCR 11a of the voltage variable delay element 10a.

The oscillation frequency f of the VCO shown in FIG. 7A can be expressed by the following formula:

$$1/f = Reff*Ceff = Ceff/\{k*(Vcont-Vt)+1/R\} \quad (3).$$

Note that as in the case of the formula (2), there is a term of an offset that is proportional to 1/R.

Thus, with the VCO of the second embodiment, similar effect to that of the first embodiment can be obtained. However, since the constant resistance element 13 requires a larger pattern area on the LSI chip, as compared to the PMOS transistors P1 and P2, the addition of a constant resistance element 13 to each of the voltage variable delay element causes a more increase in the chip area as compared to the case of the first embodiment.

(Third Embodiment)

The third embodiment of the present invention is a PLL (Phase Locked Loop) made of the VCO of the first embodiment or its alternative versions, or the VCO of the second embodiment of the present invention.

Figure 8:
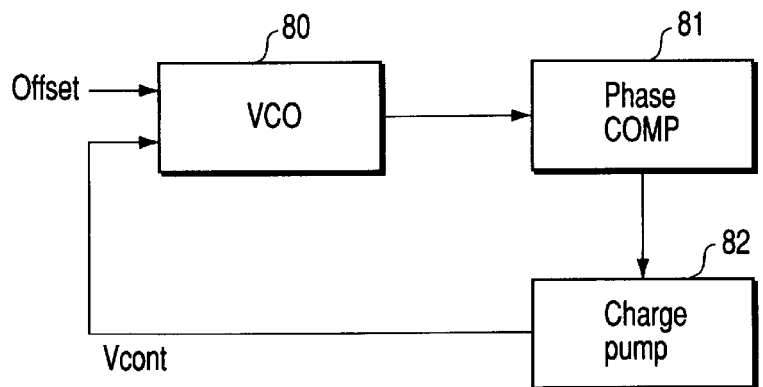
FIG. 8 is a block diagram showing an example of a PLL (Phase Locked Loop) according to a third embodiment of the present invention.
Figure 10:
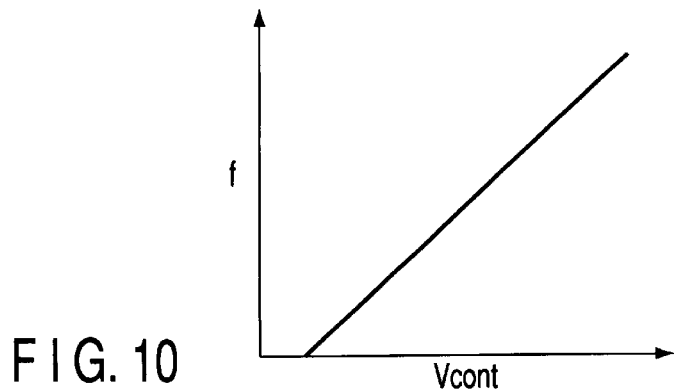
FIG. 10 is a characteristic diagram showing the relationship between the control voltage Vcont and the oscillation frequency f in the VCO shown in FIG. 9A.

FIG. 8 shows an example of the PLL according to the third embodiment of the present invention.

This PLL comprises a digital phase comparator circuit (Phase COMP) 81 that compares phases of an output clock of a VCO 80 and an input clock, and a charge pump-type control voltage generating circuit 82 that generates a control voltage Vcont in response to an comparison output from the phase comparator circuit 81 and inputs it to the bias circuit of the VCO. With this structure, the phase of the output clock of the VCO 80 can be synchronized with the phase of the input clock.

The PLL of the third embodiment employs the VCO 80 that has an excellent noise tolerance characteristic as described above, and therefore the PLL itself can be achieved to have a high noise tolerance characteristic.

(Fourth Embodiment)

The first to third embodiments were explained in connection with cases where the voltage controlled differential type delay circuit of the present invention is applied to an VCO or a PLL that employs such a VCO; however it is alternatively possible that the voltage controlled differential type delay circuit of the present invention is applied to a voltage controlled delay (VCD) circuit or a delay locked loop (DLL) that employs such a VCD circuit.

More specifically, it is possible to achieve a voltage controlled delay circuit having a structure in which, for example, a plurality of voltage variable delay elements 10 as indicated in the first embodiment are connected in cascade, and bias voltages VCP and VCN are supplied from bias circuits 20 to the VCR 11 of the voltage variable delay element 10 of each stage.

In such a voltage controlled delay circuit, the voltage variable delay elements that have an excellent noise tolerance characteristic are employed, and therefore the advantage of a high noise tolerance characteristic can be achieved as well in this embodiment.

As described above, with the semiconductor integrated circuit of the present invention, it is possible to control the variation amount of the delay of the voltage variable delay element, that corresponds to the variation amount of the controlled voltage input to the bias circuit that supplies a bias voltage to the voltage variable differential type delay element.

With the above-described circuit applied to a voltage controlled oscillator, the clock signal can be generated in a high-frequency region without deteriorating the noise tolerance characteristic. Or when applied to a voltage controlled delay circuit, an excellent delay control characteristic can be achieved without deteriorating the noise tolerance characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a differential type voltage controlled delay cell including a first voltage controlled resistor element and a current source transistor of a MOS type differential amplifier circuit, the first voltage controlled resistor element functioning as a load resistor, wherein a resistance value of the first voltage controlled resistor element is controlled according to a first bias voltage, and a current of the current source transistor is controlled according to a second bias voltage; and
   a bias circuit including a first replica circuit and a second replica circuit, the first replica circuit having a structure equivalent to that of the voltage controlled delay cell, the second replica circuit having a structure equivalent to a structure in which the first voltage controlled resistor element of the voltage controlled delay cell is replaced by a constant resistor element, the bias circuit configured to generate and supply the first bias voltage and the second bias voltage to the voltage controlled delay cell.

2. A semiconductor integrated circuit according to claim 1, in which the bias circuit including:
   the first replica circuit wherein including a second voltage controlled resistor element which has a structure equivalent to that of the first voltage controlled resistor element of the voltage controlled delay cell and functions as a load resistor of a first MOS transistor, wherein a resistance value of the second voltage controlled resistor element functioning as the load resistor of the first MOS transistor is controlled according to an input control voltage, the second replica circuit wherein the constant resistor element functions as a load resistor of a second MOS transistor, and an end of the constant resistor element on a side of the second MOS transistor is connected to an end of the second voltage controlled resistor element of the first replica circuit on a side of the first MOS transistor, a buffer circuit including a third voltage controlled resistor element which has a structure equivalent to that of the first voltage controlled resistor element of the voltage controlled delay cell and functions as a load resistor of a third MOS transistor, the buffer circuit configured to generate and supply the first bias voltage to the first voltage controlled resistor element of the voltage controlled delay cell, and the MOS type differential amplifier circuit configured to compare a voltage of a common connection node of the second voltage controlled resistor element of the first replica circuit and the constant resistor element of the second replica circuit with the input control voltage to generate a second bias voltage and feed-back control currents flowing through the first MOS transistor the second MOS transistors the third MOS transistor and a current source transistor of the MOS type differential amplifier circuit to make the voltage of a common connection node and the input control voltage equal to each other, wherein the first bias voltage generated by the buffer circuit and the input control voltage have different voltage values to each other, and a current flowing through the first voltage controlled resistor element of the voltage controlled delay cell equals to a current of an average of a current flowing through the second voltage controlled resistor element of the first replica circuit and a current flowing through the constant resistor element of the second replica circuit.

3. A semiconductor integrated circuit according to claim 1, in which the second replica circuit further includes a switch element to cut off a path of the current flowing through the constant resistor element of the second replica circuit, the switch element being selectively driven by a control input.

4. A semiconductor integrated circuit according to claim 2, in which the second replica circuit further includes a switch element to cut off a path of the current flowing through the constant resistor element of the second replica circuit, the switch element being selectively driven by a control input.

5. A semiconductor integrated circuit according to claim 1, in which the second replica circuit includes a plurality of circuits in each of which the constant resistor element functions as a load resistor of a MOS transistor and each including a switch element to cut off a path of the current flowing through the constant resistor element, the switch element being selectively driven by a control input.

6. A semiconductor integrated circuit according to claim 2, in which the second replica circuit includes a plurality of circuits in each of which the constant resistor element functions as a load resistor of the second MOS transistor and each including a switch element to cut off a path of the current flowing through the constant resistor element, the switch element being selectively driven by a control input.

7. A semiconductor integrated circuit according to claim 1, in which the constant resistor element is formed of a passive element.

8. A semiconductor integrated circuit according to claim 1, comprising a plurality of the voltage controlled delay cells connected in a ring form and constituting a voltage controlled oscillator.

9. A semiconductor integrated circuit according to claim 8, further comprising a frequency divider configured to divide an output of the voltage controlled oscillator by 1/N and a multiplexer configured to select one of the output of the voltage controlled oscillator and an output of the frequency divider.

10. A semiconductor integrated circuit according to claim 8, in which a phase locked loop is formed of the voltage controlled oscillator.

11. A semiconductor integrated circuit according to claim 1, comprising a plurality of the voltage controlled delay cells connected in a cascade form and constituting a voltage controlled delay circuit.

12. A semiconductor integrated circuit according to claim 11, in which the voltage controlled delay circuit is used in a delay locked loop.

* * * * *